(12) United States Patent
Morita et al.

(10) Patent No.: US 10,527,676 B2
(45) Date of Patent: Jan. 7, 2020

(54) ABNORMALITY DIAGNOSING DEVICE AND ABNORMALITY DIAGNOSING METHOD

(71) Applicant: FANUC CORPORATION, Yamanashi (JP)

(72) Inventors: Yuuki Morita, Yamanashi-ken (JP); Tadashi Okita, Yamanashi-ken (JP); Kenji Takahashi, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/968,181

(22) Filed: May 1, 2018

(65) Prior Publication Data
US 2018/0321322 A1 Nov. 8, 2018

(30) Foreign Application Priority Data
May 2, 2017 (JP) .................................. 2017-091516

(51) Int. Cl.
*H02K 17/32* (2006.01)
*G01R 31/34* (2006.01)
(Continued)

(52) U.S. Cl.
CPC ......... *G01R 31/346* (2013.01); *G01R 31/343* (2013.01); *H02H 7/08* (2013.01);
(Continued)

(58) Field of Classification Search
CPC ...... H02P 29/037; H02P 29/02; H02P 29/027; H02P 29/10
See application file for complete search history.

(56) References Cited

U.S. PATENT DOCUMENTS

| 4,724,503 A | 2/1988 | Libert |
| 5,703,459 A | 12/1997 | Yasohara |

(Continued)

FOREIGN PATENT DOCUMENTS

| CN | 101387688 A | 3/2009 |
| CN | 103248307 A | 8/2013 |

(Continued)

OTHER PUBLICATIONS

English Abstract for Japanese Publication No. 2012090383 A, published May 10, 2012, 1 pg.

(Continued)

*Primary Examiner* — Karen Masih
(74) *Attorney, Agent, or Firm* — Fredrikson & Byron, P.A.

(57) ABSTRACT

An abnormality diagnosing device diagnoses a driving abnormality of a single motor driven by a plurality of motor driving devices. The motor driving devices drive the motor by supplying three-phase alternating currents to a plurality of three-phase windings possessed by the motor. The abnormality diagnosing device is equipped with a rotational speed acquisition unit for acquiring a rotational speed value of the motor, a current acquisition unit for acquiring phase current values of respective phases flowing through the three-phase windings, and a determination unit for determining the presence of an abnormality, if an absolute value of the rotational speed value exceeds a predetermined value, and an absolute value of the phase current value of any one phase of the three-phase windings is less than a threshold value continuously for a predetermined time period.

15 Claims, 6 Drawing Sheets

(51) Int. Cl.
*H02P 3/18* (2006.01)
*H02P 29/024* (2016.01)
*H02H 7/08* (2006.01)
*G01R 31/42* (2006.01)

(52) U.S. Cl.
CPC ............ *H02P 3/18* (2013.01); *H02P 29/0241* (2016.02); *G01R 31/42* (2013.01)

(56) References Cited

U.S. PATENT DOCUMENTS

| | | | |
|---|---|---|---|
| 2012/0001574 A1 | 1/2012 | Akaishi et al. | |
| 2013/0179040 A1 | 7/2013 | Suzuki | |
| 2013/0220727 A1 | 8/2013 | Suzuki | |
| 2014/0265960 A1* | 9/2014 | Sonoda ................ | H02P 6/12 318/400.21 |
| 2015/0103449 A1* | 4/2015 | Son ....................... | H02H 7/093 361/23 |
| 2016/0134212 A1 | 5/2016 | Kikuchi et al. | |
| 2016/0156291 A1 | 6/2016 | Becker | |

FOREIGN PATENT DOCUMENTS

| | | | |
|---|---|---|---|
| CN | 105467266 A | 4/2016 | |
| CN | 105799541 A | 7/2016 | |
| CN | 106291352 A | 1/2017 | |
| DE | 10201005008 A1 | 9/2010 | |
| JP | 2005-102409 A | 4/2005 | |
| JP | 201216102 A | 1/2012 | |
| JP | 201265416 A | 3/2012 | |
| JP | 201290383 A | 5/2012 | |
| JP | 2012-147531 A | 8/2012 | |
| JP | 2016-001945 A | 1/2016 | |
| JP | 2016-201922 A | 12/2016 | |
| WO | 2014203300 A1 | 12/2014 | |

OTHER PUBLICATIONS

English Abstract for Japanese Publication No. 2012016102 A, published Jan. 19, 2012, 2 pgs.
English Abstract and Machine Translation for Japanese Publication No. 2012-065416 A, published Mar. 29, 2012, 11 pgs.
English Abstract and Machine Translation for Japanese Publication No. 2005-102409 A, published Apr. 14, 2005, 7 pgs.
English Abstract and Machine Translation for Japanese Publication No. 2012-147531 A, published Aug. 2, 2012, 13 pgs.
English Abstract and Machine Translation for Japanese Publication No. 2016-001945 A, published Jan. 7, 2016, 8 pgs.
English Abstract and Machine Translation for Japanese Publication No. 2016-201922 A, published Dec. 1, 2016, 10 pgs.
English Abstract and Machine Translation for Chinese Publication No. 105799541 A, published Jul. 27, 2016, 6 pgs.
English Abstract and Machine Translation for Chinese Publication No. 106291352 A, published Jan. 4, 2017, 13 pgs.
English Abstract and Machine Translation for Chinese Publication No. 101387688 A, published Mar. 18, 2009, 18 pgs.
English Abstract and Machine Translation for Chinese Publication No. 103248307 A, published Aug. 14, 2013, 10 pgs.
English Abstract and Machine Translation for Chinese Publication No. 105467266 A, published Apr. 6, 2016, 8 pgs.
English Abstract and Machine Translation for German Publication No. 102010005008 A1, published Sep. 16, 2010, 29 pgs.

\* cited by examiner

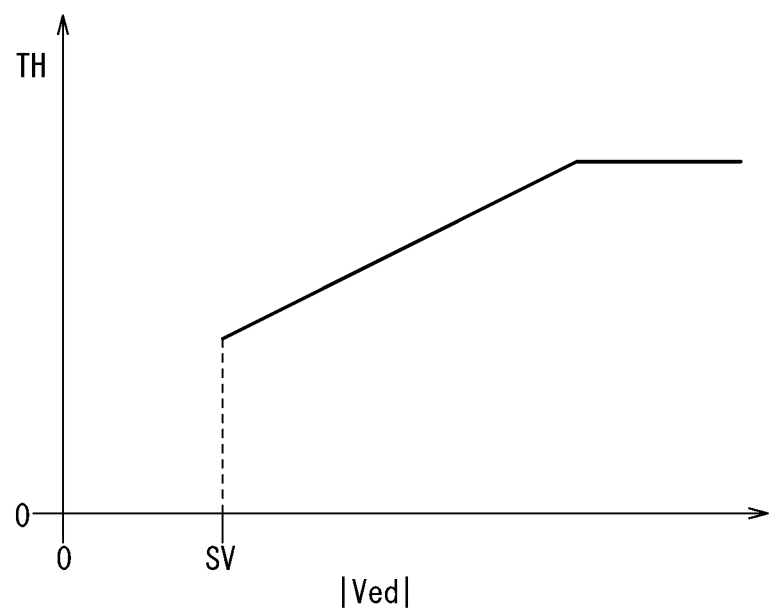

ABNORMALITY DIAGNOSING DEVICE AND ABNORMALITY DIAGNOSING METHOD

CROSS-REFERENCE TO RELATED APPLICATION

This application is based upon and claims the benefit of priority from Japanese Patent Application No. 2017-091516 filed on May 2, 2017, the contents of which are incorporated herein by reference.

BACKGROUND OF THE INVENTION

Field of the Invention

The present invention relates to an abnormality diagnosing device and an abnormality diagnosing method for diagnosing a driving abnormality of a single motor that is driven by a plurality of motor driving devices.

Description of the Related Art

In Japanese Laid-Open Patent Publication No. 2005-102409, a printing device is disclosed that detects an abnormality in relation to a motor driving device that controls a motor. To provide a brief description thereof, the printing device comprises a plurality of phase detection circuits connected to each of a plurality of motor phases (A-phase, *A-phase, B-phase, *B-phase), and including a first detection circuit adapted to detect the occurrence of an abnormality in relation to pulses output to the motor phases, and a second detection circuit adapted to detect the occurrence of an overcurrent in the motor phases, and logic output devices that perform logic outputs indicating abnormalities in relation to the motor driving device on the basis of the detection results from the plurality of phase detection circuits.

SUMMARY OF THE INVENTION

However, in Japanese Laid-Open Patent Publication No. 2005-102409, an abnormality in relation to the motor driving device is detected when a single motor is driven by one motor driving device, and no consideration is given to a case in which a motor driving abnormality is detected when a single motor is driven by a plurality of motor driving devices.

Thus, the present invention has the object of providing an abnormality diagnosing device and an abnormality diagnosing method that enables diagnosis of a driving abnormality of a single motor that is driven by a plurality of motor driving devices.

A first aspect of the present invention is characterized by an abnormality diagnosing device adapted to diagnose a driving abnormality of a single motor that is driven by a plurality of motor driving devices, wherein the plurality of motor driving devices drive the motor by supplying a three-phase alternating current to a plurality of three-phase windings possessed by the motor, the abnormality diagnosing device comprising, a rotational speed acquisition unit adapted to acquire a rotational speed value of the motor, a current acquisition unit adapted to acquire phase current values of respective phases flowing through the three-phase windings, and a determination unit adapted to determine the presence of an abnormality, if an absolute value of the rotational speed value exceeds a predetermined value and an absolute value of the phase current value of any one phase of the three-phase windings is less than a threshold value, continuously for a predetermined time period.

A second aspect of the present invention is characterized by an abnormality diagnosing method for diagnosing a driving abnormality of a single motor that is driven by a plurality of motor driving devices, wherein the plurality of motor driving devices drive the motor by supplying a three-phase alternating current to a plurality of three-phase windings possessed by the motor, the abnormality diagnosing method comprising, a rotational speed acquisition step of acquiring a rotational speed value of the motor, a current acquisition step of acquiring phase current values of respective phases flowing through the three-phase windings, and a determination step of determining the presence of an abnormality, if an absolute value of the rotational speed value exceeds a predetermined value and an absolute value of the phase current value of any one phase of the three-phase windings is less than a threshold value, continuously for a predetermined time period.

According to the present invention, with a simple configuration, a driving abnormality of a single motor that is driven by a plurality of motor driving devices can be diagnosed.

The above and other objects, features, and advantages of the present invention will become more apparent from the following description when taken in conjunction with the accompanying drawings, in which preferred embodiments of the present invention are shown by way of illustrative example.

BRIEF DESCRIPTION OF THE DRAWINGS

FIG. 6 is a graph showing a relationship between a threshold value TH and an absolute value of a rotational speed value, in the case that the threshold value TH changes depending on the absolute value of the rotational speed value.

DESCRIPTION OF THE PREFERRED EMBODIMENTS

Preferred embodiments of an abnormality diagnosing device and an abnormality diagnosing method according to the present invention will be presented and described in detail below with reference to the accompanying drawings.

Figure 1:
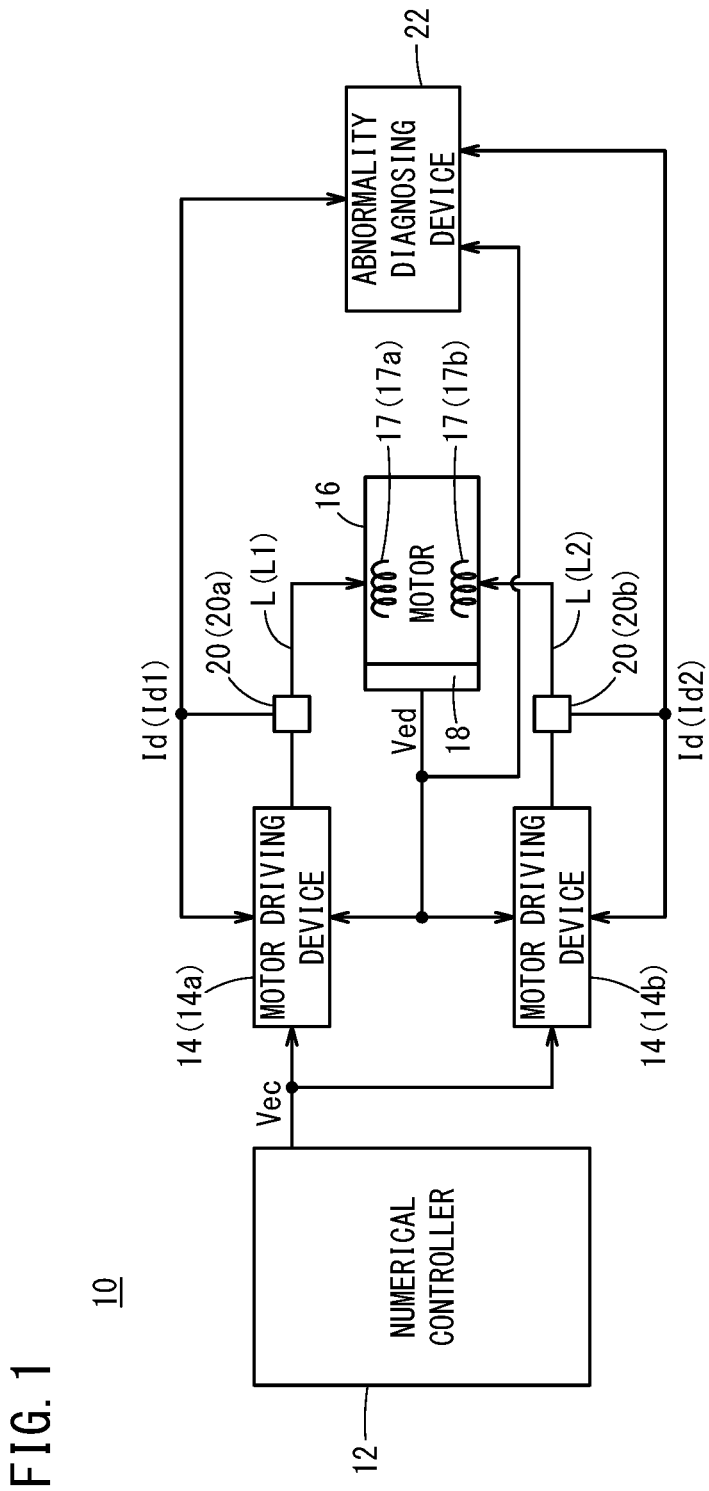
FIG. 1 is a schematic configuration diagram of an abnormality diagnosis system according to an embodiment of the present invention.

FIG. 1 is a schematic configuration diagram of an abnormality diagnosis system 10. The abnormality diagnosis system 10 is equipped with a numerical controller 12, a plurality of motor driving devices 14, a motor 16, a rotational speed detecting unit 18, current detecting units 20, and an abnormality diagnosing device 22.

According to the present embodiment, in order to simplify the description, it is assumed that the number of motor driving devices 14 is two, and the rotation of a single motor 16 is controlled by using the two motor driving devices 14.

Further, in order to distinguish the two motor driving devices 14 from each other, in certain cases, one of the motor driving devices 14 may be represented by 14a, and the other of the motor driving devices 14 may be represented by 14b.

The motor 16 is a synchronous motor. Corresponding to the two motor driving devices 14 (14a, 14b), the motor 16 has two windings of three phases (hereinafter referred to as three-phase windings) 17 including a U-phase, a V-phase, and a W-phase. The three-phase winding 17 corresponding to the motor driving device 14a is referred to as a first three-phase winding (winding) 17a, and the three-phase winding 17 corresponding to the motor driving device 14b is referred to as a second three-phase winding (winding) 17b in certain cases. The first three-phase winding 17a and the second three-phase winding 17b are disposed on a stator of the motor 16. In accordance therewith, it is possible to increase the output (rotational force) of the motor 16. The two motor driving devices 14 (14a, 14b) and the two three-phase windings 17 (17a, 17b) are connected by three-phase conductive wires L (L1, L2). According to the present embodiment, the motor 16 is a synchronous motor; however, the motor 16 may be a motor other than a synchronous motor (for example, an induction motor).

In order to control the motor 16, the numerical controller 12 outputs a speed command or a position command to the two motor driving devices 14 (14a, 14b). According to the present embodiment, it is assumed that the numerical controller 12 outputs a speed command to the two motor driving devices 14 (14a, 14b). Hereinafter, the speed command will be represented by Vec.

The two motor driving devices 14 (14a, 14b) apply voltages to the three-phase windings 17 (17a, 17b) of the motor 16 on the basis of the speed command Vec, whereby three-phase alternating currents are supplied to the first three-phase winding 17a and the second three-phase winding 17b. Consequently, the motor 16 is rotated (driven). The motor driving device 14a supplies a three-phase alternating current to the first three-phase winding 17a of the motor 16 via the conductive wire L1, whereas the motor driving device 14b supplies a three-phase alternating current to the second three-phase winding 17b of the motor 16 via the conductive wire L2.

The rotational speed detecting unit 18 is a sensor that detects a rotational speed value (rotational speed value of a rotary axis) Ved of the motor 16. The rotational speed detecting unit 18 is constituted by an encoder or the like. The current detecting units 20 are provided on each of the conductive wires L (L1, L2), and detect three-phase alternating current values Id (Iu, Iv, Iw), which are supplied to the motor 16 from each of the two motor driving devices 14 (14a, 14b). The current detecting unit 20 that detects the three-phase alternating current value Id (Id1) flowing through the first three-phase winding 17a may be represented by 20a, and the current detecting unit 20 that detects the three-phase alternating current value Id (Id2) flowing through the second three-phase winding 17b may be represented by 20b in certain cases. Iu indicates the phase current value of the U-phase, Iv indicates the phase current value of the V-phase, and Iw indicates the phase current value of the W-phase. The phase current values Iu, Iv and Iw satisfy the relationship Iu+Iv+Iw=0.

The two motor driving devices 14 (14a, 14b) feedback control the motor 16 using the rotational speed value Ved detected by the rotational speed detecting unit 18, and the three-phase alternating current values Id (Id1, Id2) detected by the current detecting units 20 (20a, 20b).

The abnormality diagnosing device 22 diagnoses whether or not driving of the motor 16 is normal. As cases in which driving of the motor 16 is abnormal, there are included, for example, a case in which the motor 16 is driven in a state in which at least one phase of the three-phase winding 17 is disconnected. For example, in the case that at least one phase of the first three-phase winding 17a is disconnected and the motor 16 is driven, or in the case that at least one phase of the second three-phase winding 17b is disconnected and the motor 16 is driven, the abnormality diagnosing device 22 diagnoses that driving of the motor 16 is abnormal.

On the basis of the rotational speed value Ved detected by the rotational speed detecting unit 18, and the three-phase alternating current values Id (Id1, Id2) detected by the two current detecting units 20 (20a, 20b), the abnormality diagnosing device 22 determines whether or not driving of the motor 16 is normal. The abnormality diagnosing device 22 will be described in detail later.

Figure 2:
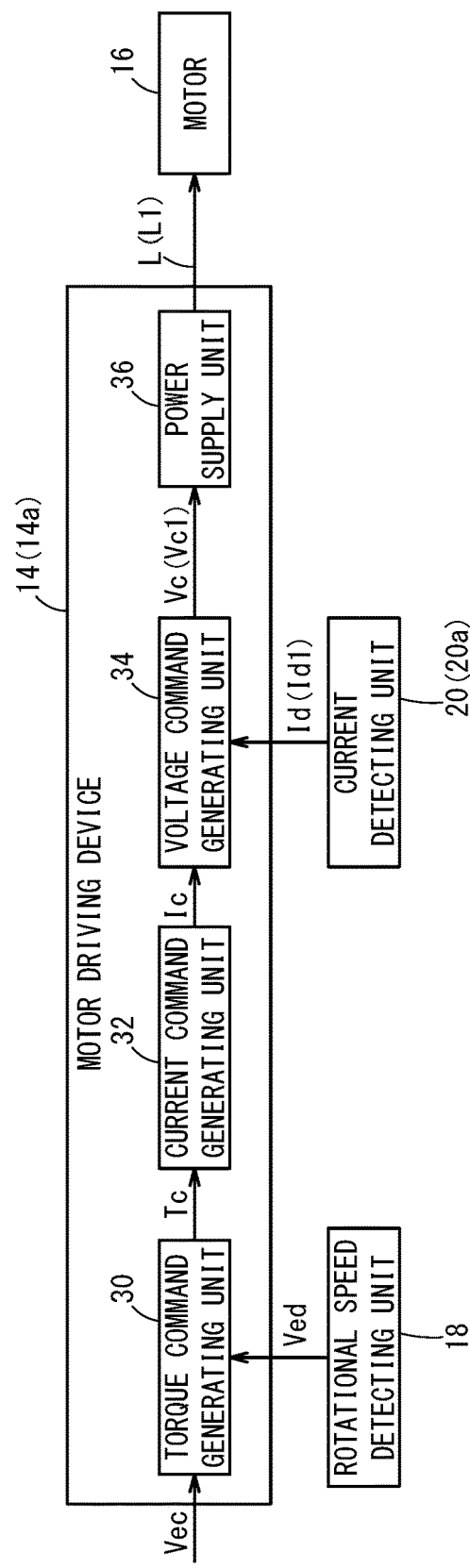
FIG. 2 is a diagram showing the configuration of a motor driving device shown in FIG. 1.

FIG. 2 is a diagram showing the configuration of a motor driving device 14a. Since the motor driving device 14b has the same configuration as that of the motor driving device 14a, the motor driving device 14a will be described as representative. The motor driving device 14a is equipped with a torque command generating unit 30, a current command generating unit 32, a voltage command generating unit 34, and a power supply unit 36.

The torque command generating unit 30 generates (calculates) a torque command value Tc on the basis of the speed command Vec commanded from the numerical controller 12. The torque command generating unit 30 generates the torque command value Tc using the rotational speed value Ved, which is a feedback value detected by the rotational speed detecting unit 18. More specifically, the torque command generating unit 30 calculates the torque command value Tc based on a difference between the speed command Vec and the rotational speed value Ved. The torque command generating unit 30 outputs the generated (calculated) torque command value Tc to the current command generating unit 32.

The current command generating unit 32 generates (calculates) a current command value Ic on the basis of the torque command value Tc transmitted thereto from the torque command generating unit 30. The current command generating unit 32 outputs the generated (calculated) current command value Ic to the voltage command generating unit 34.

The voltage command generating unit 34 generates (calculates) a voltage command value Vc1 on the basis of the current command value Ic transmitted thereto from the current command generating unit 32. The voltage command generating unit 34 generates the voltage command value Vc1 using the three-phase alternating current value Id1 (Iu, Iv, Iw), which is a feedback value detected by the current detecting unit 20a.

More specifically, the voltage command generating unit 34 generates the voltage command value Vc1 in a manner so that the three-phase alternating current value Id1 (Iu, Iv, Iw), which is detected by the current detecting unit 20a, becomes a three-phase alternating current corresponding to the current command value Ic. The voltage command generating unit 34 outputs the generated (calculated) voltage command value Vc1 to the power supply unit 36.

The power supply unit 36 serves as a driver for driving the motor 16, and includes, for example, an inverter circuit or the like that converts the current supplied from the power supply into a three-phase alternating current. The power supply unit 36 supplies the three-phase alternating current to the first three-phase winding 17*a* by applying a voltage to the first three-phase winding 17*a* of the motor 16 on the basis of the voltage command value Vc1. Consequently, the motor 16 is driven.

Moreover, in the case of the motor driving device 14*b*, the voltage command generating unit 34 generates the voltage command value Vc2 using the three-phase alternating current value Id2 (Iu, Iv, Iw), which is a feedback value detected by the current detecting unit 20*b*. Further, on the basis of the voltage command value Vc2, the power supply unit 36 supplies the three-phase alternating current to the second three-phase winding 17*b* of the motor 16.

Figure 3:
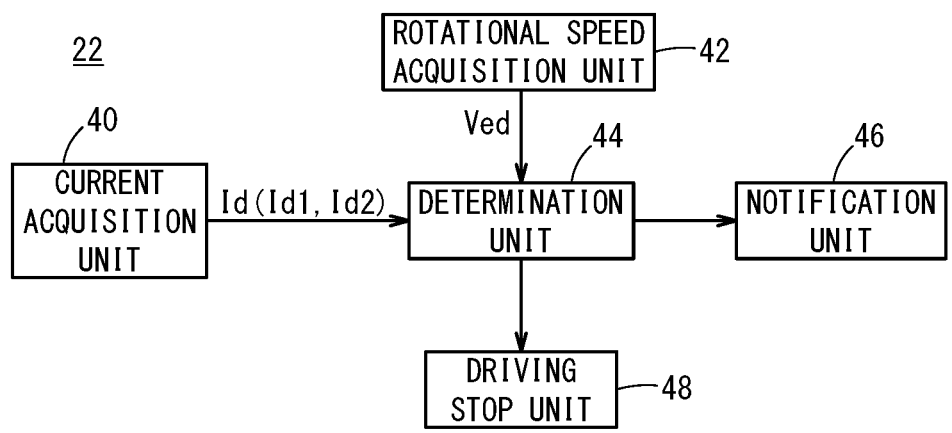
FIG. 3 is a diagram showing the configuration of an abnormality diagnosing device shown in FIG. 1.

FIG. 3 is a diagram showing the configuration of the abnormality diagnosing device 22. The abnormality diagnosing device 22 is constituted by a computer having a processor such as a central processing unit (CPU) or the like and a storage medium. The abnormality diagnosing device 22 is equipped with a current acquisition unit 40, a rotational speed acquisition unit 42, a determination unit 44, a notification unit 46, and a driving stop unit 48.

The current acquisition unit 40 acquires the three-phase alternating current value Id1 (Iu, Iv, Iw) flowing through the first three-phase winding 17*a*, which is detected by the current detecting unit 20*a*, and the second three-phase alternating current value Id2 (Iu, Iv, Iw) flowing through the second three-phase winding 17*b*, which is detected by the current detecting unit 20*b*. The current acquisition unit 40 outputs the acquired three-phase alternating current values Id1, Id2 to the determination unit 44.

The rotational speed acquisition unit 42 acquires the rotational speed value Ved of the motor 16 as detected by the rotational speed detection unit 18. The rotational speed acquisition unit 42 outputs the acquired rotational speed value Ved to the determination unit 44.

The determination unit 44 includes a clock circuit that measures or clocks the passage of time. The clock circuit increments a count value C at a predetermined cycle, thereby making it possible to clock the passage of time. Using the three-phase alternating current value Id1 flowing through the first three-phase winding 17*a*, the determination unit 44 determines whether or not at least one phase of the first three-phase winding 17*a* is disconnected. Further, using the three-phase alternating current value Id2 flowing through the second three-phase winding 17*b*, the determination unit 44 determines whether or not at least one phase of the second three-phase winding 17*b* is disconnected. The determination unit 44 determines that driving of the motor 16 is abnormal, if it is determined that at least one phase is disconnected, from within at least one of the three-phase windings 17 of the first three-phase winding 17*a* and the second three-phase winding 17*b*.

More specifically, the determination unit 44 determines that driving of the motor 16 is abnormal, in the case that the absolute value of the rotational speed value Ved exceeds the predetermined value SV (|Ved|>SV), and the absolute value of the phase current value of any one phase from among the alternating current values Id (Id1, Id2) flowing through the respective three-phase windings 17 (17*a*, 17*b*) is less than the threshold value TH (|Iu|<TH, |Iv|<TH, or |Iw|<TH), continuously for a predetermined time period. In this case, among the three phases of the respective three-phase windings 17 (17*a*, 17*b*), the phase for which the absolute value of the phase current value is less than the threshold value TH is disconnected.

As for the reason for determining whether or not the absolute value of the rotational speed value Ved exceeds the predetermined value SV, it is because, in the case that the voltage command value Vc is small, the rotational speed of the motor 16 decreases, and there is a possibility that the abnormality determination cannot be performed correctly.

Further, as for the reason for determining whether or not the absolute value of the phase current value of any one of the three-phase windings 17 (17*a*, 17*b*) is less than the threshold value TH, the reason is because, in the case that the phase of any one of the three-phase windings 17 (17*a*, 17*b*) is disconnected, the phase current value of the disconnected phase is constantly 0 (zero). Moreover, in the case that two phases of the three-phase windings 17 (17*a*, 17*b*) are disconnected, the phase current values of the respective phases of the three-phase windings 17 (17*a*, 17*b*) all become 0 (zero).

As for the reason for determining whether the predetermined time period has elapsed in the case that the absolute value of the rotational speed value Ved exceeds the predetermined value SV and the phase current value of any one phase of the three-phase windings 17 (17*a*, 17*b*) is less than the threshold value TH, the reason is because the phase current values Iu, Iv, Iw of the respective phases fluctuate temporally, and therefore, cases may exist in which the phase current values Iu, Iv, Iw become less than the threshold value TH even if a disconnection has not occurred.

Moreover, the determination unit 44 may determine that driving of the motor 16 is abnormal, if the absolute value of the rotational speed value Ved exceeds the predetermined value SV, the absolute value of the phase current value of any one phase of the three-phase windings 17 (17*a*, 17*b*) is less than the threshold value TH, and the absolute value of a sum of the phase current values of the remaining phases is less than the threshold value TH.

For example, in the case that the absolute value of the phase current value Iu is less than the threshold value TH (|Iu|<TH), or in the case that the absolute value of the sum of the phase current values Iv, Iw of the remaining phases is less than the threshold value TH (|Iv+Iw|<TH), the determination unit 44 may determine that driving of the motor 16 is abnormal. In this instance, the relationship |Iu|=|Iv+Iw| holds true from the relational expression Iu+Iv+Iw=0. Accordingly, in the case of |Iu|<TH, although |Iv+Iw|<TH also holds true, in order to prevent an erroneous determination of an abnormality, for purposes of confirmation, a determination is also made that the absolute value of the sum of the remaining phases is less than the threshold value TH continuously for a predetermined time period.

If it is determined by the determination unit 44 that driving of the motor 16 is abnormal, the notification unit 46 and the driving stop unit 48 carry out an alarm process.

When it is determined that driving of the motor 16 is abnormal, as the alarm process, the notification unit 46 issues a notifying alarm to the operator. The notification unit 46 may comprise a non-illustrated display unit, and may issue a notification by displaying an alarm message on the display unit. Further, the notification unit 46 may comprise a non-illustrated speaker or a light emitting unit, and may issue a notifying alarm by way of sound or light. Further, the notification unit 46 may display the notifying alarm on a display unit of the numerical controller 12. Further, the notification unit 46 may issue the notifying alarm using an externally provided speaker, or may issue the notifying alarm by causing light to be emitted from an externally provided light emitting unit.

When it is determined that driving of the motor 16 is abnormal, as the alarm process, the driving stop unit 48 stops driving of the motor 16 by the two motor driving devices 14 (14*a*, 14*b*). When it is determined that driving of the motor 16 is abnormal, the driving stop unit 48 stops driving of the motor 16 by outputting a stop signal to the two motor driving devices 14 (14a, 14b). When the stop signal is transmitted thereto, the two motor driving devices 14 (14a, 14b) stop the supply of power to the motor 16. For example, the voltage command generating unit 34 may stop the supply of power to the motor 16 by inhibiting output of the voltage command values Vc (Vc1, Vc2) to the power supply unit 36.

Moreover, according to the present embodiment, when it is determined that driving of the motor 16 is abnormal, both the alarm notification and stopping driving of the motor 16 are performed. However, only one of such actions may be performed as the alarm process.

Figure 4:
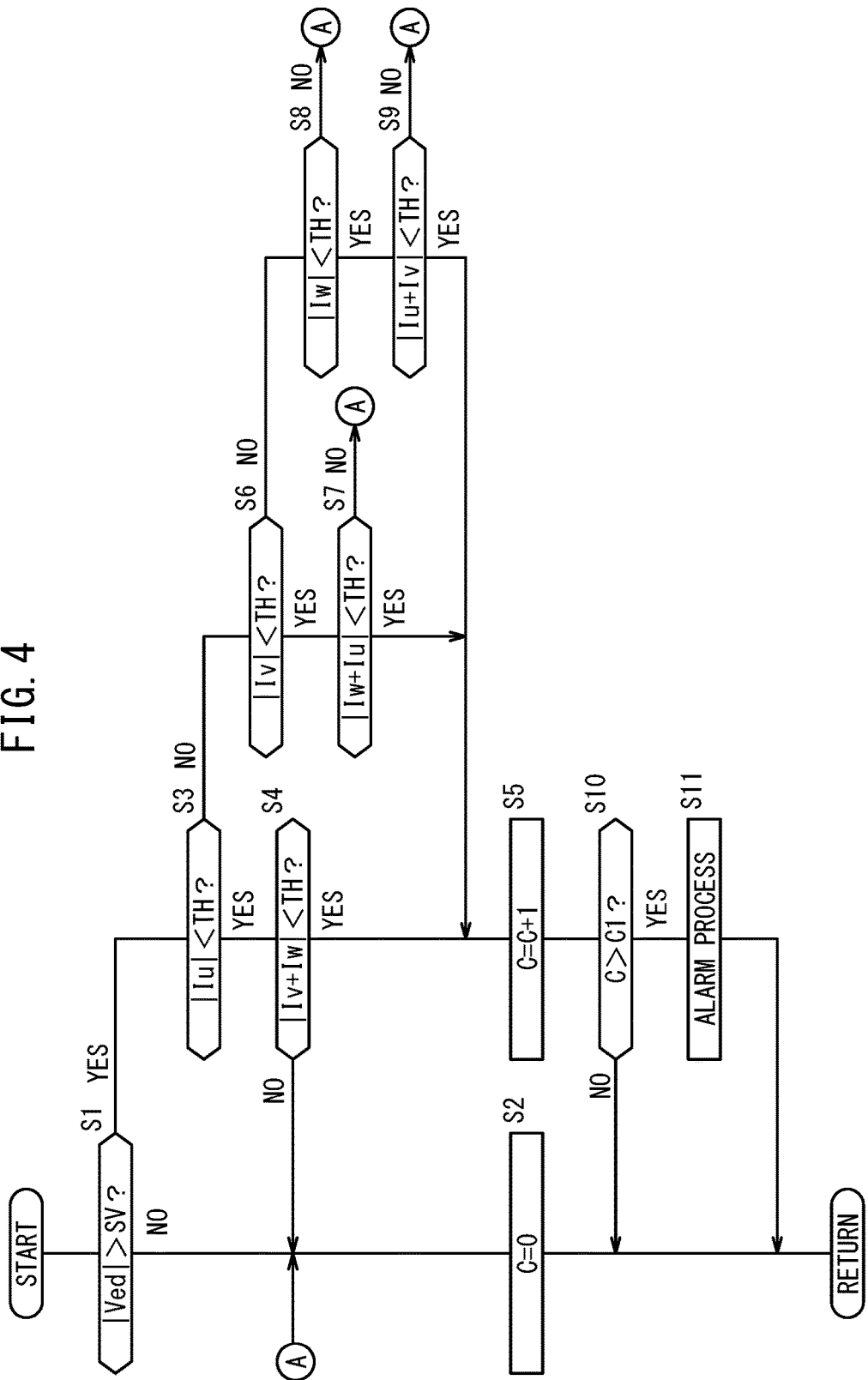
FIG. 4 is a flowchart showing operations of the abnormality diagnosing device shown in FIG. 1.

Next, operations of the abnormality diagnosing device 22 will be described with reference to the flowchart shown in FIG. 4. The operations shown in FIG. 4 are executed at a predetermined cycle. Further, it is assumed that the rotational speed detecting unit 18 and the current detecting units 20 (20a, 20b) detect the rotational speed value Ved and the alternating current values Id (Id1, Id2) at a cycle that is less than or equal to the predetermined cycle.

In step S1, the determination unit 44 determines whether or not the absolute value of the rotational speed value Ved acquired by the rotational speed acquisition unit 42 is greater than the predetermined value SV (|Ved|>SV?).

If it is determined in step S1 that the absolute value of the rotational speed value Ved is less than or equal to the predetermined value SV, the process proceeds to step S2. On the other hand, if it is determined in step S1 that the absolute value of the rotational speed value Ved is greater than the predetermined value SV, the process proceeds to step S3.

Upon proceeding to step S2, the determination unit 44 resets the count value C to zero (C=0), and then the present operations are brought to an end.

Upon proceeding to step S3, the determination unit 44 determines whether or not the absolute value of the phase current value Iu of the U-phase is less than the threshold value TH (|Iu|<TH?). If it is determined in step S3 that the absolute value of the phase current value Iu of the U-phase is less than the threshold value TH, the process proceeds to step S4.

Upon proceeding to step S4, the determination unit 44 determines whether or not the absolute value of the sum of the phase current values Iv, Iw of the V-phase and the W-phase is less than the threshold value TH (|Iv+Iw|<TH?).

If it is determined in step S4 that the absolute value of the sum of the phase current values Iv, Iw of the V-phase and the W-phase is greater than or equal to the threshold value TH, the process proceeds to step S2. On the other hand, if it is determined in step S4 that the absolute value of the sum of the phase current values Iv, Iw of the V-phase and the W-phase is less than the threshold value TH, the process proceeds to step S5.

If it is determined in step S3 that the absolute value of the phase current value Iu of the U-phase is greater than or equal to the threshold value TH, the process proceeds to step S6, whereupon the determination unit 44 determines whether or not the absolute value of the phase current value Iv of the V-phase is less than the threshold value TH (|Iv|<TH?).

If it is determined in step S6 that the absolute value of the phase current value Iv of the V-phase is less than the threshold value TH, the process proceeds to step S7, whereupon the determination unit 44 determines whether or not the absolute value of the sum of the phase current values Iw, Iu of the W-phase and the U-phase is less than the threshold value TH (|Iw+Iu|<TH?).

If it is determined in step S7 that the absolute value of the sum of the phase current values Iw, Iu of the W-phase and the U-phase is greater than or equal to the threshold value TH, the process proceeds to step S2. On the other hand, if it is determined in step S7 that the absolute value of the sum of the phase current values Iw, Iu of the W-phase and the U-phase is less than the threshold value TH, the process proceeds to step S5.

If it is determined in step S6 that the absolute value of the phase current value Iv of the V-phase is greater than or equal to the threshold value TH, the process proceeds to step S8, whereupon the determination unit 44 determines whether or not the absolute value of the phase current value Iw of the W-phase is less than the threshold value TH (|Iw|<TH?).

If it is determined in step S8 that the absolute value of the phase current value Iw of the W-phase is greater than or equal to the threshold value TH, the process proceeds to step S2. On the other hand, if it is determined in step S8 that the absolute value of the phase current value Iw of the W-phase is less than the threshold value TH, the process proceeds to step S9.

Upon proceeding to step S9, the determination unit 44 determines whether or not the absolute value of the sum of the phase current values Iu, Iv of the U-phase and the V-phase is less than the threshold value TH (|Iu+Iv|<TH?). If it is determined in step S9 that the absolute value of the sum of the phase current values Iu, Iv of the U-phase and the V-phase is greater than or equal to the threshold value TH, the process proceeds to step S2. On the other hand, if it is determined in step S9 that the absolute value of the sum of the phase current values Iu, Iv of the U-phase and the V-phase is less than the threshold value TH, the process proceeds to step S5.

Upon proceeding to step S5, the determination unit 44 increments the count value C (C=C+1). Stated otherwise, the determination unit 44 increments the count value C in the case that the absolute value of the phase current value Iu is less than the threshold value TH, and the absolute value of the sum of the phase current values Iv, Iw is less than the threshold value TH, in the case that the absolute value of the phase current value Iv is less than the threshold value TH, and the absolute value of the sum of the phase current values Iw, Iu is less than the threshold value TH, or in the case that the absolute value of the phase current value Iw is less than the threshold value TH, and the absolute value of the sum of the phase current values Iu, Iv is less than the threshold value TH.

Next, in step S10, the determination unit 44 determines whether or not the current count value C is greater than a predetermined value C1. Stated otherwise, in step S10, it is determined whether or not a predetermined time period has elapsed with the states of "YES in steps S1, S3, and S4", "YES in steps S1, S6, and S7", or "YES in steps S1, S8, and S9".

If it is determined in step S10 that the current count value C is less than or equal to the predetermined value C1, the present operations are brought to an end. On the other hand, if it is determined in step S10 that the current count value C is greater than the predetermined value C1, the determination unit 44 determines that driving of the motor 16 is abnormal, and the process proceeds to step S11.

Upon proceeding to step S11, an alarm process is performed. More specifically, the notification unit 46 issues a notifying alarm to the operator, together with the driving stop unit 48 stopping driving of the motor 16 by the two motor driving devices 14 (14a, 14b).

The determination unit 44 performs the operations shown in FIG. 4 based on the three-phase alternating current value Id1 (Iu, Iv, Iw) detected by the current detecting unit 20*a*, and based on the three-phase alternating current value Id2 (Iu, Iv, Iw) detected by the current detecting unit 20*b*. Accordingly, in the case that any one phase of at least one of the three-phase windings 17 from among the two three-phase windings 17 (17*a*, 17*b*) is disconnected, an abnormality is determined, and the alarm process is carried out.

In the foregoing manner, the abnormality diagnosing device 22 determines whether or not driving of the motor 16 is abnormal using the rotational speed value Ved detected by the rotational speed detecting unit 18, and the alternating current values Id (Id1, Id2) detected by the current detecting units 20 (20*a*, 20*b*). Therefore, with a simple configuration, it is possible to diagnose a driving abnormality of the single motor 16 which is driven by the two motor driving devices 14 (14*a*, 14*b*).

[Modifications]

The above-described embodiment may be modified in the following manner.

<Modification 1>

In the above-described embodiment, the abnormality diagnosing device 22 is provided separately from the numerical controller 12 and the motor driving devices 14. However, the abnormality diagnosing device 22 may be constituted by the numerical controller 12. Stated otherwise, the abnormality diagnosing device 22 may be provided within the numerical controller 12. In accordance with this feature, there is no need to separately provide the abnormality diagnosing device 22, thus resulting in a reduction in costs.

The abnormality diagnosing device 22 may also be constituted by the motor driving devices 14. Stated otherwise, the abnormality diagnosing device 22 may be provided within the motor driving devices 14. In this case, the abnormality diagnosing device 22 may be provided in at least one of the plurality of motor driving devices 14, or the abnormality diagnosing device 22 may be provided in all of the plurality of motor driving devices 14. In accordance with this feature, there is no need to separately provide the abnormality diagnosing device 22, costs can be reduced, and the abnormality diagnosis can be performed promptly.

<Modification 2>

In the above-described embodiment, one abnormality diagnosing device 22 was provided. However, a plurality of abnormality diagnosing devices 22 may be provided corresponding to the plurality of three-phase windings 17. For example, in the case that the motor 16 has two three-phase windings 17 (17*a*, 17*b*), two abnormality diagnosing devices 22 are provided. In this case, the abnormality diagnosing devices 22 may be provided separately from the motor driving devices 14 (14*a*, 14*b*) that supply current to the corresponding three-phase windings 17 (17*a*, 17*b*), or may be provided within the motor driving devices 14 (14*a*, 14*b*) that supply current to the corresponding three-phase windings 17 (17*a*, 17*b*).

Figure 5:
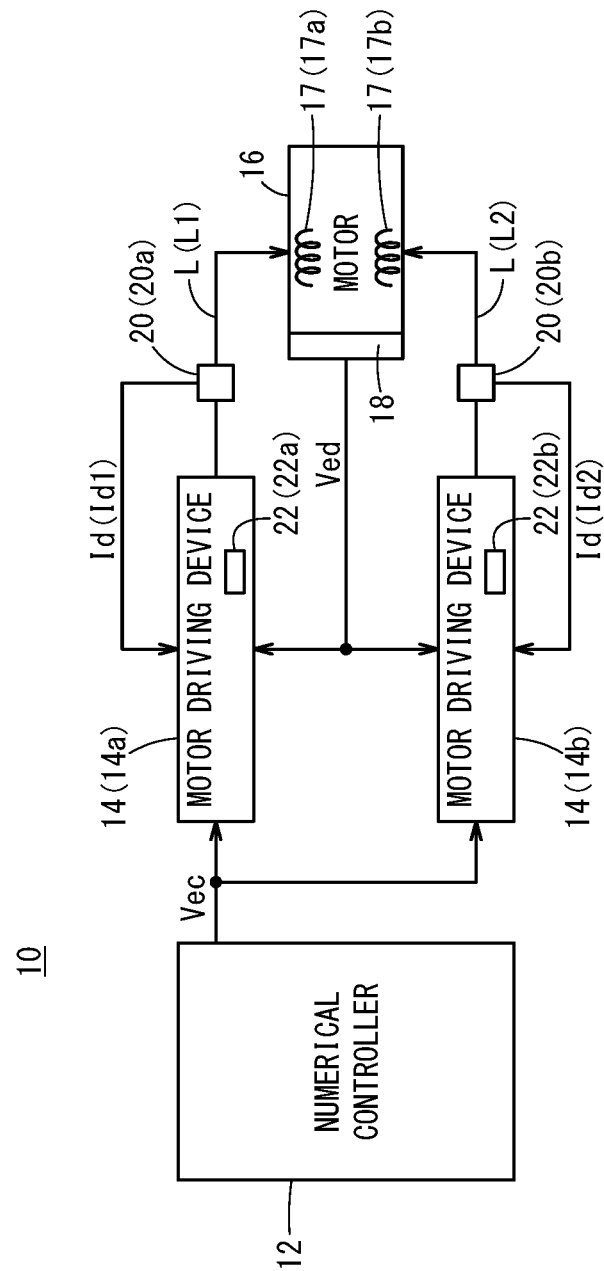
FIG. 5 is a schematic configuration diagram of an abnormality diagnosis system according to a second modification.

FIG. 5 is a diagram showing an abnormality diagnosis system 10 for a case in which a plurality of abnormality diagnosing devices 22 are provided respectively in the motor driving devices 14 (14*a*, 14*b*) that supply current to the corresponding three-phase windings 17 (17*a*, 17*b*). In FIG. 5, the abnormality diagnosing device 22 disposed in the motor driving device 14*a* corresponding to the first three-phase winding 17*a* is denoted by 22*a*, whereas the abnormality diagnosing device 22 disposed in the motor driving device 14*b* corresponding to the second three-phase winding 17*b* is denoted by 22*b*.

The determination unit 44 of the abnormality diagnosing device 22*a* determines whether or not driving of the motor 16 is abnormal, on the basis of the alternating current value Id1 (Iu, Iv, Iw) detected by the current detecting unit 20*a*. Stated otherwise, the abnormality diagnosing device 22*a* determines whether or not at least one phase of the first three-phase winding 17*a* is disconnected, and if it is determined that at least one phase is disconnected, a determination is made that driving of the motor 16 is abnormal.

When it is determined by the determination unit 44 of the abnormality diagnosing device 22*a* that driving of the motor 16 is abnormal, the driving stop unit 48 of the abnormality diagnosing device 22*a* stops driving of the motor 16 by the motor driving device 14*a*, and together therewith, by sending a stop signal to the motor driving device 14*b*, driving of the motor 16 by the motor driving device 14*b* is also stopped. Consequently, driving of the motor 16 is stopped.

Similarly, the determination unit 44 of the abnormality diagnosing device 22*b* determines whether or not driving of the motor 16 is abnormal, on the basis of the alternating current value Id2 (Iu, Iv, Iw) detected by the current detecting unit 20*b*. Stated otherwise, the abnormality diagnosing device 22*b* determines whether or not at least one phase of the second three-phase winding 17*b* is disconnected, and if it is determined that at least one phase is disconnected, a determination is made that driving of the motor 16 is abnormal.

When it is determined by the determination unit 44 of the abnormality diagnosing device 22*b* that driving of the motor 16 is abnormal, the driving stop unit 48 of the abnormality diagnosing device 22*b* stops driving of the motor 16 by the motor driving device 14*b*, and together therewith, by sending a stop signal to the motor driving device 14*a*, driving of the motor 16 by the motor driving device 14*a* is also stopped. Consequently, driving of the motor 16 is stopped.

By providing the plurality of abnormality diagnosing devices (22) respectively in the motor driving devices 14 (14*a*, 14*b*) that supply current to the corresponding three-phase windings 17 (17*a*, 17*b*), costs can be reduced, together with enabling the abnormality diagnosis to be performed promptly.

<Modification 3>

In the above-described embodiment and Modifications 1 and 2, the threshold value TH is constant; however, the threshold value TH may be changed. For example, the determination unit 44 causes the threshold value TH to increase as the absolute value of the rotational speed value Ved increases. This is because, in the case that the absolute value of the rotational speed value Ved is small, the alternating current supplied to the three-phase windings 17 also becomes small. Owing to this feature, it is possible to accurately determine which of the phases of the three-phase windings 17 is disconnected.

FIG. 6 is a graph showing, in Modification 3, a relationship between the threshold value TH and the absolute value of the rotational speed value Ved. As shown in FIG. 6, until the absolute value of the rotational speed value Ved reaches a certain value, the threshold value TH gradually increases accompanying an increase in the absolute value of the rotational speed value Ved, and when the absolute value of the rotational speed value Ved reaches the certain value, the threshold value TH becomes constant. Further, in FIG. 6, the threshold value TH at a time when the absolute value of the rotational speed value Ved is less than the predetermined value SV is not shown. This is because, in the case that the absolute value of the rotational speed value Ved is less than or equal to the predetermined value SV, the process branches to NO in step S1 of FIG. 4, and therefore, the abnormality determination is not carried out (the threshold value TH is not used).

<Modification 4>

In the above-described embodiment and Modifications 1 to 3, the numerical controller 12 outputs the speed command Vec to the two motor driving devices 14 (14a, 14b). However, the speed command Vec may be output only to either one of the motor driving devices 14. Moreover, in the description of Modification 4, the motor driving device 14 to which the speed command Vec is input is 14a, and the motor driving device 14 to which the speed command Vec is not input is 14b.

In addition, the motor driving device 14a outputs the torque command value Tc, which was generated on the basis of the speed command Vec, or the current command value Ic, which was generated on the basis of the torque command value Tc, to the motor driving device 14b. In the case that the torque command value Tc is input to the motor driving device 14b, the current command generating unit 32 of the motor driving device 14b generates the current command value Ic on the basis of the input torque command value Tc. Further, in the case that the current command value Ic is input to the motor driving device 14b, the voltage command generating unit 34 of the motor driving device 14b generates the voltage command value Vc2 on the basis of the current command value Ic input thereto, and the alternating current value Id2, which is a feedback value.

[Technical Concepts Obtained from the Embodiments]

Technical concepts which can be grasped from the above-described embodiments and Modifications 1 to 4 will be described below.

The abnormality diagnosing device (22) diagnoses a driving abnormality of the single motor (16) that is driven by the plurality of motor driving devices (14). The plurality of motor driving devices (14) drive the motor (16) by supplying three-phase alternating currents to the plurality of three-phase windings (17) possessed by the motor (16). The abnormality diagnosing device (22) is equipped with the rotational speed acquisition unit (42) adapted to acquire the rotational speed value (Ved) of the motor (16), the current acquisition unit (40) adapted to acquire the phase current values of respective phases flowing through the three-phase windings (17), and the determination unit (44) adapted to determine the presence of an abnormality, if the absolute value of the rotational speed value (Ved) exceeds the predetermined value (SV) and the absolute value of the phase current value of any one phase of the three-phase windings (17) is less than the threshold value (TH), continuously for a predetermined time period.

In accordance with these features, with a simple configuration, it is possible to diagnose a driving abnormality (for example, a driving abnormality due to disconnection of the three-phase windings (17) or the like) of the single motor (16) which is driven by the plurality of motor driving devices (14).

The determination unit (44) may determine that there is an abnormality, if the absolute value of the rotational speed value (Ved) exceeds a predetermined value (SV), an absolute value of the phase current value of any one phase of the three-phase windings (17) is less than the threshold value (TH) and an absolute value of a sum of the phase current values of the remaining phases is less than the threshold value (TH), continuously for a predetermined time period. Consequently, with a simple configuration, a driving abnormality of the single motor (16) that is driven by the plurality of motor driving devices (14) can be diagnosed. Further, an erroneous determination of abnormality can be prevented.

The determination unit (44) may change the threshold value (TH) depending on the magnitude of the absolute value of the rotational speed value (Ved). In accordance with this feature, the accuracy of the abnormality determination is improved.

The abnormality diagnosing device (22) may further be equipped with the notification unit (46) adapted to issue a notifying alarm if the presence of an abnormality is determined by the determination unit (44). Owing to this feature, the operator can recognize that a driving abnormality of the motor (16) has occurred.

The abnormality diagnosing device (22) may further be equipped with the driving stop unit (48) adapted to stop driving of the motor (16) by the plurality of motor driving devices (14) if the presence of an abnormality is determined by the determination unit (44). In accordance with this feature, it is possible to prevent the motor (16) for which driving is determined to be abnormal from being driven as it is.

The abnormality diagnosing device (22) may be provided in the motor driving device (14). In accordance with this feature, there is no need to separately provide the abnormality diagnosing device (22), costs can be reduced, and the abnormality diagnosis can be performed promptly.

A plurality of the abnormality diagnosing devices (22) may be provided corresponding to the plurality of three-phase windings (17). Each of the plurality of abnormality diagnosing devices (22) may determine whether or not driving of the motor (16) is abnormal, on the basis of the phase current values of respective phases of the corresponding three-phase windings (17). In accordance with this feature, the abnormality diagnosis can be performed promptly.

The current acquisition unit (40) may acquire the phase current values of respective phases flowing through each of the plurality of three-phase windings (17). The determination unit (44) may determine whether or not driving of the motor (16) is abnormal, on the basis of the phase current values of the respective phases flowing through each of the plurality of three-phase windings (17). In accordance with this feature, with respect to the plurality of three-phase windings (17), it is possible to diagnose with a signal abnormality diagnosing device (22) whether there is a driving abnormality due to a disconnection.

Although certain preferred embodiments of the present invention have been shown and described in detail, it should be understood that various changes and modifications may be made therein without departing from the scope of the appended claims.

What is claimed is:

1. An abnormality diagnosing device adapted to diagnose a driving abnormality of a single motor that is driven by a plurality of motor driving devices;
   wherein the plurality of motor driving devices drive the motor by supplying a three-phase alternating current to a plurality of three-phase windings possessed by the motor;
   the abnormality diagnosing device comprising:
   a rotational speed acquisition unit adapted to acquire a rotational speed value of the motor;
   a current acquisition unit adapted to acquire phase current values of respective phases flowing through the three-phase windings; and a determination unit adapted to determine a presence of an abnormality, if an absolute value of the rotational speed value exceeds a predetermined value, and an absolute value of the phase current value of any one phase of the three-phase windings is less than a threshold value, continuously for a predetermined time period.

2. The abnormality diagnosing device according to claim 1, wherein the determination unit determines that there is an abnormality, if the absolute value of the rotational speed value exceeds a predetermined value, an absolute value of the phase current value of any one phase of the three-phase windings is less than the threshold value, and an absolute value of a sum of the phase current values of remaining phases is less than the threshold value, continuously for a predetermined time period.

3. The abnormality diagnosing device according to claim 1, wherein the determination unit changes the threshold value depending on a magnitude of the absolute value of the rotational speed value.

4. The abnormality diagnosing device according to claim 1, further comprising a notification unit adapted to issue a notifying alarm if the presence of an abnormality is determined by the determination unit.

5. The abnormality diagnosing device according to claim 1, further comprising a driving stop unit adapted to stop driving of the motor by the plurality of motor driving devices if the presence of an abnormality is determined by the determination unit.

6. The abnormality diagnosing device according to claim 1, wherein the abnormality diagnosing device is provided in the motor driving device.

7. The abnormality diagnosing device according to claim 1, wherein:
- a plurality of the abnormality diagnosing devices are provided corresponding to the plurality of three-phase windings; and
- each of the plurality of the abnormality diagnosing devices determines whether or not driving of the motor is abnormal, on a basis of the phase current values of respective phases of the corresponding three-phase windings.

8. The abnormality diagnosing device according to claim 1, wherein:
- the current acquisition unit acquires the phase current values of respective phases flowing through each of the plurality of three-phase windings; and
- the determination unit determines whether or not driving of the motor is abnormal, on a basis of the phase current values of the respective phases flowing through each of the plurality of three-phase windings.

9. An abnormality diagnosing method for diagnosing a driving abnormality of a single motor that is driven by a plurality of motor driving devices;
wherein the plurality of motor driving devices drive the motor by supplying a three-phase alternating current to a plurality of three-phase windings possessed by the motor;

the abnormality diagnosing method comprising:
- a rotational speed acquisition step of acquiring a rotational speed value of the motor;
- a current acquisition step of acquiring phase current values of respective phases flowing through the three-phase windings; and
- a determination step of determining a presence of an abnormality, if an absolute value of the rotational speed value exceeds a predetermined value, and an absolute value of the phase current value of any one phase of the three-phase windings is less than a threshold value, continuously for a predetermined time period.

10. The abnormality diagnosing method according to claim 9, wherein in the determining step, it is determined that there is an abnormality, if the absolute value of the rotational speed value exceeds a predetermined value, an absolute value of the phase current value of any one phase of the three-phase windings is less than the threshold value, and an absolute value of a sum of the phase current values of remaining phases is less than the threshold value, continuously for a predetermined time period.

11. The abnormality diagnosing method according to claim 9, wherein in the determining step, the threshold value is changed depending on a magnitude of the absolute value of the rotational speed value.

12. The abnormality diagnosing method according to claim 9, further comprising a notifying step of issuing a notifying alarm if the presence of an abnormality is determined by the determining step.

13. The abnormality diagnosing method according to claim 9, further comprising a driving stop step of stopping driving of the motor by the plurality of motor driving devices if the presence of an abnormality is determined by the determining step.

14. The abnormality diagnosing method according to claim 9, wherein:
- the abnormality diagnosing method is implemented by each of the plurality of motor driving devices; and
- in the determining step, it is determined whether or not driving of the motor is abnormal, on a basis of the phase current values of respective phases of the three-phase windings to which its own motor driving device supplies the three-phase alternating current.

15. The abnormality diagnosing method according to claim 9, wherein:
- in the current acquisition step, the phase current values of respective phases flowing through each of the plurality of three-phase windings are acquired; and
- in the determining step, it is determined whether or not driving of the motor is abnormal, on a basis of the phase current values of the respective phases flowing through each of the plurality of three-phase windings.

* * * * *